(12) United States Patent
Schwartz et al.

(10) Patent No.: US 9,773,962 B2
(45) Date of Patent: Sep. 26, 2017

(54) FORMATION OF BISMUTH STRONTIUM CALCIUM COPPER OXIDE SUPERCONDUCTORS

(71) Applicant: NORTH CAROLINA STATE UNIVERSITY, Raleigh, NC (US)

(72) Inventors: Justin Schwartz, Raleigh, NC (US); Carl C. Koch, Raleigh, NC (US); Yun Zhang, Raleigh, NC (US); Xiaotao Liu, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 226 days.

(21) Appl. No.: 14/433,986

(22) PCT Filed: Oct. 8, 2013

(86) PCT No.: PCT/US2013/063838
§ 371 (c)(1),
(2) Date: Apr. 7, 2015

(87) PCT Pub. No.: WO2014/058852
PCT Pub. Date: Apr. 17, 2014

(65) Prior Publication Data
US 2015/0270471 A1    Sep. 24, 2015

Related U.S. Application Data

(60) Provisional application No. 61/710,977, filed on Oct. 8, 2012.

(51) Int. Cl.
*H01L 39/24*    (2006.01)
*C22C 1/04*    (2006.01)
(Continued)

(52) U.S. Cl.
CPC ............ *H01L 39/248* (2013.01); *B22F 5/12* (2013.01); *C22C 1/0491* (2013.01);
(Continued)

(58) Field of Classification Search
CPC .. H01L 39/248; H01L 39/2477; C22C 1/0491
(Continued)

(56) References Cited

U.S. PATENT DOCUMENTS 5,180,707 A    1/1993    Gao et al.
5,885,938 A    3/1999    Otto et al.
(Continued)

OTHER PUBLICATIONS

Aksenova, et al. "Texture Formation in $Bi_2Sr_2Ca_1Cu_2O_x$/ Ag Tapes Prepared by Partial Melt Process", Physica C 205 (1993) pp. 271-279.
(Continued)

*Primary Examiner* — Paul Wartalowicz
(74) *Attorney, Agent, or Firm* — Womble Carlyle Sandridge & Rice, LLP

(57) ABSTRACT

A Bi2212 article may be formed by mixing metallic precursor powders including bismuth, strontium, calcium and copper in an oxygen-free atmosphere, mechanically alloying the metallic precursor powders in an oxygen-free atmosphere, and heating the metallic precursor alloy according to a temperature profile. The profile may include a ramp-up stage during which the alloy is heated to a peak temperature in an oxygen-free atmosphere, a dwell stage during which the alloy is held at the peak temperature for a dwell time, and a ramp-down stage during which the alloy is cooled from the peak temperature. During at least a portion of the dwell stage, the oxygen-free atmosphere is switched to an oxygen-inclusive atmosphere, wherein the alloy is oxidized to form
(Continued)

a superconducting oxide, which may be sintered during or after oxidation. The alloy may be formed into a shape, such as a wire, prior to oxidizing.

37 Claims, 11 Drawing Sheets

(51) Int. Cl.
    *C22C 1/10*           (2006.01)
    *B22F 5/12*           (2006.01)
    *B22F 9/04*           (2006.01)
(52) U.S. Cl.
    CPC ........ *C22C 1/1084* (2013.01); *H01L 39/2451* (2013.01); *H01L 39/2477* (2013.01); *B22F 9/04* (2013.01); *B22F 2009/041* (2013.01); *B22F 2009/043* (2013.01); *B22F 2009/044* (2013.01); *B22F 2999/00* (2013.01)
(58) Field of Classification Search
    USPC ........................................................ 505/121
    See application file for complete search history.

(56) References Cited

U.S. PATENT DOCUMENTS

| | | | | |
|---|---|---|---|---|
| 5,999,833 A * | 12/1999 | Funahashi | ............. | H01L 39/248 428/702 |
| 6,295,716 B1 * | 10/2001 | Rupich | ............... | C04B 35/4521 29/599 |
| 2012/0138843 A1 | 6/2012 | Fleurial et al. | | |

OTHER PUBLICATIONS

Bernik, "Synthesis and Phase Relations of the 110 K Superconducting 2223 Phase in the Bi-Pb-Sr-Ca-Cu-O System", Supercond. Sci. Technol 10 (1997), pp. 671-677.
Buhl, et al. "Phase Composition and Grain Alignment in Partial Melt Processed Bi-2212 Thick Films", Applied Superconductivity, vol. 4, No. 7/8, pp. 299-317, (1996).
Callaway, et al. "Statistical Analysis of the Relationship Between Electrical Transport and Filament Microstructure in Multifilamentary $Bi_2Sr_2CaCu_2O_x$/Ag/Ag-Mg Round Wires", Supercond. Sci. Technol 27 (2014), pp. 1-8.
Cecchetti, et al. "A model for Texture Development in BSCCO High-$T_c$, Superconductors", Supercond. Sci. Technol. 13 (2000), pp. 1270-1278.
Devred, et al. "Future Accelerator Magnet Needs", IEEE Transactions on Applied Superconductivity, vol. 15 No. 2 Jun. 2005, pp. 1192-1199.
Dietderich, et al. "Textured Thick Films of $Bi_2Sr_2Ca_1Cu_2O_x$", Japanese Journal of Applied Physics, vol. 29, No. 7 Jul. 1990, pp. L1100-L1103.
Emmen, et al. "Crystal Growth and Annealing Experiments of the High $T_c$, Superconductor $Bi_2Sr_2CaCu_2O_{8+\delta}$", Journal of Crystal Growth, vol. 118, pp. 477-482 (1992).
Gourlay, et al. "Magnet R&D for the US LHC Accelerator Research Program (LARP)", IEEE Transactions on Applied Superconductivity, vol. 16 No. 2 Jun. 2006, pp. 324-327.
Grivel, et al. "Formation Mechanism of the Pb Free $Bi_2Sr_2Ca_2Cu_3O_{10}$ Phase", Supercond. Sci. Technol 11 (1998), pp. 288-298.
Hatano, et al. "High-Temperature X-ray Study of Melting and Solidification of the $Bi_2Sr_2CaCu_2O_{8+\delta}$ on Silver", Journal of Low Temperature Physics, vol. 117, No. 3/4 (1999), pp. 777-781.
Heeb, et al., "From Imperfect to Perfect $Bi_2Sr_2CaCu_2O_x$ (Bi-2212) Grains", Journal of Materials Research vol. 8 No. 9 (1993), pp. 2170-2176.

Heinrich, et al. "HREM Observation of Stacking Sequences in Bulk Bi—Sr—Ca—Cu—O Superconductors and Identification of Phases by ED and EDX", Ultramicroscopy 49 (1993) pp. 265-272.
Hellstrom, et al. "Formation and Prevention of Bubbles when Melt Processing Ag-Sheathed $Bi_2Sr_2CaCu_2O_x$ (2212) Conductors", Supercond. Sci. Technol. 8 (1995), pp. 317-323.
Holesinger, et al. Directional Isothermal Growth of Highly Textured $Bi_2Sr_2CaCU_2O_y$, Appl. Phys. Lett. 63 (1993), pp. 982-984.
Holesinger, et al. "Isothermal Melt Processing of $Bi_2Sr_2CaCu_2O_y$ Round Wire", Physica C 253 (1995) pp. 182-190.
Holesinger, et al. "Solid Solution Region of the $Bi_2Sr_2CaCu_2O_y$ Superconductor", Physica C 217 (1993) pp. 85-96.
Hu, et al. "Formation Mechanism of High-$T_c$ Phase and Critical Current in $(Bi,Pb)_2Sr_2Ca_2Cu_3O_{10}$/Ag Tape", Physica C 250, (1995), pp. 7-14.
Jiang, et al. "Doubled Critical Current Density in Bi-2212 Round Wires by Reduction of the Residual Bubble Density", Supercond. Sci. Technol.. 24 (2011), pp. 1-5.
Kametani, et al. "Bubble Formation within Filaments of Melt-Processed Bi2212 Wires and its Strongly Negative Effect on the Critical Current Density", Supercond. Sci. Technol. 24 (2011), pp. 1-7.
Kumakura, "Development of Bi-2212 Conductors and Magnets for High-Magnetic-Field Generation", Supercond. Sci. Technol 13 (2000) pp. 34-42.
Kumakura, et al. "Influence of Ag Substrates on Grain Alignment and Critical Current Density of Bi-2212 Tape Conductors", IEEE Transactions on Applied Superconductivity, vol. 9, No. 2, Jun. 1999, pp. 1804-1807.
Lang, et al. "Influence of the Maximum Temperature During Partial Melt-Processing of Bi-2212 Thick Films on Microstructure and $j_c$", Physica C 294 (1998) pp. 7-16.
Lang, et al. "Melting of Bi-2212 Under Controlled Oxygen Partial Pressures with Silver", Physica C 275 (1997) pp. 284-292.
Lang, et al. "Phase Assemblage and Morphology During the Partial Melt Processing of Bi-2212 Thick Films", Physica C 281 (1997) pp. 283-292.
Lang, et al. "Texture in Melt-Processed Bi-2212", Journal of Electroceramics 1:2, (1997), pp. 133-144.
Lo, et al. "A Study of the Formation Processes of the 2212 Phase in the Bi-Based Superconductor Systems", Physica C 193 (1992) pp. 253-263.
Luo, et al. "Phase Chemistry and Microstructure Evolution in Silver-Clad $(Bi_{2-x}Pb_x)Sr_2Ca_2Cu_3O_y$ Wires" IEEE Transactions on Applied Superconductivity, vol. 3 No. 1 Mar. 1993 pp. 972-975.
Majewski, "BiSrCaCuO High-$T_c$ Superconductors", Advanced Materials, vol. 6 No. 6, (1994), pp. 460-469.
Majewski, "Phase Diagram Studies in the System Bi—Pb—Sr—Ca—Cu—O—Ag", Supercond. Sci. Technol 10 (1997), pp. 453-467.
Majewski, et al. "Cu Diffusion Into Ag During BSCCO Tape Processing", Physica C 351 (2001) pp. 62-66.
Majewski, et al. "The High-$T_c$ Superconducting Solid Solution $Bi_{2+x}(Sr,Ca)_3Cu_2O_{8+d}$ (2212 Phase)—Chemical Composition and Superconducting Properties", Advanced Materials, 1992, vol. 4 No. 7/8, pp. 508-511.
Majewski, et al. "The Oxygen Content of the High-Temperature Superconducting Compound $Bi_{2+x}Sr_{3-y}Ca_yCu_2O_{8+d}$ as a Function of the Cation Concentration", Physica C 229 (1994) pp. 12-16.
Margulies, et al. "The Effect of Carbon on the Peritectic Melting of Bi2212 and Bi2212 + Ag", Physica C 264 (1996) pp. 133-136.
Marken, Jr. et al. "Progress in Bi-2212 Wires for High Magnetic Field Applications", IEEE Transactions on Applied Superconductivity, vol. 16 No. 2 Jun. 2006, pp. 992-995.
Matthiesen, et al. "The Effects of Anneal Time and Cooling Rate on the Formation and Texture of $Bi_2Sr_2CaCu_2O_8$ Films", IEEE Transactions on Magnetics, vol. 27, No. 2, Mar. 1991, pp. 1223-1226.
Morgan, et al. "Low Level Mobile Liquid Droplet Mechanism Allowing Development of Large Platelets of High-$T_c$ "Bi-2223" Phase within a Ceramic" Physica C 176 (1991) pp. 279-284.

(56) References Cited

OTHER PUBLICATIONS

Mozhaev, et al. "Phase Stability, Oxygen Nonstoichiometry, and Superconductivity Properties of $Bi_2Sr_2CaCu_2O_{8+\delta}$ and $Bi_{1.8}Pb_{0.4}Sr_2Ca_2Cu_3O_{10+\delta}$", Journal of Solid State Chemistry, (1995), vol. 119, pp. 120-124.

Nachtrab, et al. "Development of High Superconductor Fraction $Bi_2Sr_2CaCu_2O_x$/Ag Wire for MRI", IEEE Transactions on Applied Superconductivity, vol. 18 No. 2 Jun. 2008 pp. 1184-1187.

Nachtrab, et al. "Effect of Solidification Conditions on Partial Melt Processed Bi2212/Ag Round Wire", IEEE Transactions on Applied Superconductivity, vol. 21 No. 3 Jun. 2011, pp. 2795-2799.

Naderi, et al. "Understanding Processing-Microstructure-Properties Relationships in $Bi_2Sr_2CaCu_2O_x$/Ag Round Wire and Enhanced Transport Through Saw-Tooth Processing", Supercond. Sci. Technol. 26 (2013), pp. 1-15.

Naderi, et al., On the Roles of $Bi_2SR_2CuO_x$ Intergrowths in $Bi_2Sr_2CaCu_2O_x$/AG Round Wires: C-Axis Transport and Magnetic Flux Pinning, Applied Physics Letters, 104 (2014), pp. 152602-1 — 152602-5.

Nomura et al., Fabrication Conditions and Superconducting Properties of Ag-sheathed Bi—Sr—Ca—Cu—O Tapes Prepared by Partial Melting and Slow Cooling Process, App. Phys. Lett., 62, No. 17, (1993), pp. 2131-2133.

Ota et al., Formation of Phase Intergrowth in the Synthesis of Bi-superconducting Thin Films, Appl. Phys. Lett. 70, No. 11, (1997), pp. 1471-1473.

Polasek, et al. "Partial Melt Processing of High-Tc Bulk Bi-2212 Starting from Different Precursor Powders", Journal of Physics; Conference Series 97 (2008), pp. 1-6.

Rikel, et al. "Competitiveness of Porosity and Phase Purity in Melt Processed Bi2212/Ag Conductors", Physica C 354 (2001) pp. 321-326.

Rikel, et al. "Development of 2201 Intergrowths During Melt Processing Bi2212/Ag Conductors", Physica C 357-360 (2001) pp. 1081-1090.

Rossi, "Superconductivity: its Role, its Success and its Setbacks in the Large Hadron Collider of Cern", Supercond. Sci. Technol. 23 (2010), pp. 1-17.

Rubin, et al. "Phase Stability Limits and Solid-State Decomposition of $Bi_2Sr_2CaCu_2O_{8+\delta}$ and $Bi_2Sr_2Ca_2Cu_3O_{10+\delta}$ in Reduced Oxygen Pressures", Physica C 217 (1993) pp. 227-234.

Rubin, et al., Phase Stability Limits of $Bi_2Sr_{2Ca1}Cu_2O_{8+\delta}$ and $Bi_2Sr_2Ca_2Cu_3O_{10+\delta}$, App. Phys. Lett., 61, (1992), pp. 1977-1979.

Sager, et al. "Enhanced Residual Secondary Phase Dissolution by Atmophere Control in Bi-2212 Superconductors", Physica C 405 (2004) pp. 103-116.

Scheuerlein, et al. "Void and Phase Evolution During the Processing of Bi-2212 Superconducting Wires Monitored by Combined Fast Synchrotron Micro-Tomography and X-Ray Diffraction", Supercond. Sci. Technol 24 (2011), pp. 1-10.

Schwartz, et al. "High Field Superconducting Solenoids Via High Temperature Superconductors", IEEE Transactions on Applied Superconductivity, vol. 18 No. 2 Jun. 2008, pp. 70-81.

Shen, et al. "Filament to Filament Bridging and its Influence on Developing High Critical Current Density in Multifilamentary $Bi_2Sr_2CaCu_2O_x$ Round Wire", Supercond. Sci. Technol. 23 (2010), pp. 1-10.

Tarascon, et al. "Preparation, Structure, and Properties of the Superconducting Compound Series $Bi_2Sr_2Ca_{n-1}Cu_nO_y$ with n=1, 2, and 3", Physical Review B, vol. 38, No. 13, pp. 8885-8892 (1988).

Triscone, et al. "Variation of Superconducting Properties of $Bi_2Sr_2CaCu_2O_{8+x}$ with Oxygen Content", Physica C 176 (1991) pp. 247-256.

Zhang, et al. "The Development of an Aligned Microstructure During Melt Processing of $Bi_2Sr_2CaCu_2O_x$ (BSCCO-2212) Doctor-Bladed Films", Physica C 218 (1993) pp. 141-152.

Zhang, et al. "The Influence of Carbon on Melt Processing Ag Sheathed $Bi_2Sr_2CaCu_2O_8$ Tape", Physica C 234 (1994) pp. 137-145.

Zhang, et al., Synthesis of $Bi_2SR_2CACU_2O_x$ Superconductors Via Direct Oxidation of Metallic Precursors, Supercond. Sci. Technol., vol. 27 (2014), pp. 1-12.

\* cited by examiner

| Sample ID | Bi | Sr | Ca | Cu | Tc(K) |
|---|---|---|---|---|---|
| A.MP1000-650C800C 10%O2-2H2H | 2.03 | 1.88 | 1.13 | 2.00 | 69.0 |
| B.MP1000-650C830C 10%O2-2H2H | 2.16 | 2.11 | 1.27 | 2.00 | 78.5 |
| C.MP1000-600C830C 10%O2-2H2H | 2.17 | 2.98 | 1.61 | 2.00 | 77.5 |
| D.MP600-650C 830C 1%O2 1H1H-FC | 2.04 | 1.92 | 0.98 | 2.00 | 81.5 |
| E.NEXANS granules | 2.15 | 1.95 | 0.9 | 2.00 | 67.5 |
| 1.MP1000 RAW | 2.22 | 1.82 | 1.15 | 2.00 | / |
| 2.MP1000 -NOMINAL | 2.18 | 1.9 | 1.1 | 2.00 | / |
| 3.MP600 RAW | 2.05 | 2.00 | 0.69 | 2.00 | / |
| 4. MP600 NOMINAL | 2.15 | 1.95 | 0.9 | 2.00 | / |

Table.1 Batch info

Fig. 3

EDS mapping showing homogeneity of elemental distribution
(a) SEM image under analysis – MP600 RAW Fig.6 Morphology of cross section of heat treated sample, cut by FIB

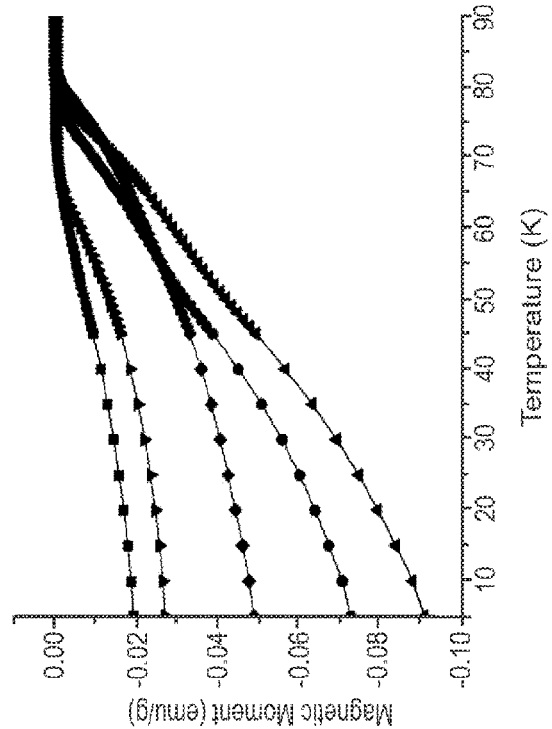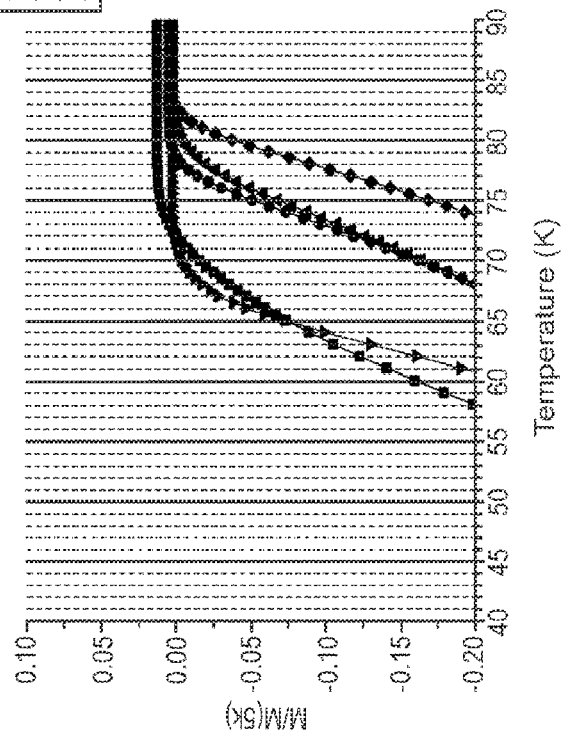
Fig. 11 (a) Tc and (b) magnetic moment measurement

FORMATION OF BISMUTH STRONTIUM CALCIUM COPPER OXIDE SUPERCONDUCTORS

RELATED APPLICATIONS

This application is a national stage filing under 35 U.S.C. 371 of PCT/US2013/063838 filed Oct. 8, 2013, which International Application was published by the International Bureau in English on Apr. 17, 2014, which application claims priority from U.S. Provisional Application No. 61/710,977, filed on Oct. 8, 2012, titled FORMATION OF BISMUTH STRONTIUM CALCIUM COPPER OXIDE SUPERCONDUCTORS, which applications are hereby incorporated in their entirety by reference in this application.

TECHNICAL FIELD

The present invention relates to the formation of superconducting materials, particularly high-temperature superconducting materials such as bismuth strontium calcium copper oxide, and articles based on such superconducting materials.

BACKGROUND

Superconductivity was discovered in complex oxides in the late 1980s. Of the many materials discovered, only two have advanced technologically such that they have the potential for commercial applications: $Bi_2Sr_2CaCu_2O_x$ (also termed BSCCO, or Bi2212) and $YBa_2Cu_3O_y$ (or YBCO). Of these two, only Bi2212 is capable of performing in the form of a round wire, which gives it a distinct advantage for applications requiring high-current cables, such as the magnets needed for high energy physics (e.g., for particle colliders such as the Large Hadron Collider), fusion reactors, and high magnetic field solenoids, including those utilized in nuclear magnetic resonance (NMR) spectrometry and imaging. By contrast, YBCO can be formed into wide, thin tapes but not round wires. Moreover, Bi2212 is the only high-field superconductor that does not have anisotropic properties, which is another advantage over YBCO.

Bi2212 superconductors for magnets are typically manufactured in the form of multi-filament composite wires. The composite has a silver alloy matrix that contains the oxide superconductor in the form of a large number (500-1000) of small (about 15 micrometers in diameter) filaments. Development of wires of this form has progressed with some success. Progress in development of Bi2212 wires, however, has recently stalled due to significant challenges that to date have not yet been overcome. First, to date all Bi2212 wires have been manufactured using oxide Bi2212 powders that have already been reacted to form the Bi2212 superconducting phase. The formation of the wire, however, requires that the composite be drawn from an initially large billet into the final wire form (the final wire may be, for example, about 1 mm in diameter or less). Silver alloys have been the only option for use as the sheathing material for a variety of reasons, but silver alloys are soft whereas the Bi2212 powders are hard. Consequently, during wire drawing the filaments do not densify, and in the final product about 30% of the filament space is actually voids. These voids significantly reduce that ability of the wire to carry electrical current, and also make the wire relatively fragile. Second, there are very few manufacturers of high quality Bi2212 starting powders, and the wire performance depends greatly on the quality of the powders. The lack of availability of starting powder limits the amount of research and development that can move forward, and scale-up for the production of large quantities of wire is an uncertain challenge.

In view of the foregoing, there is a need for providing improved methods for forming superconducting materials such as Bi2212, and for forming wires and other articles based on such superconducting materials.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a method for forming a Bi2212 article includes: mixing a plurality of metallic precursor powders including bismuth, strontium, calcium and copper in an oxygen-free atmosphere; mechanically alloying the metallic precursor powders in an oxygen-free atmosphere to form a metallic precursor alloy; heating the metallic precursor alloy according to a temperature profile including a ramp-up stage during which the metallic precursor alloy is heated to a peak temperature in an oxygen-free atmosphere, a dwell stage during which the metallic precursor alloy is held at the peak temperature for a dwell time, and a ramp-down stage during which the metallic precursor alloy is cooled from the peak temperature; and during at least a portion of the dwell stage, switching the oxygen-free atmosphere to an oxygen-inclusive atmosphere, wherein the metallic precursor alloy is oxidized to form a superconducting oxide, wherein at least a portion of the temperature profile during oxidation or following oxidation is effective for sintering the superconducting oxide.

According to another implementation, the method includes, before oxidizing, forming the metallic precursor alloy into a shape such as, for example, a plate, a tape, a film, a rod, a wire having a round cross-section, or a wire having a polygonal cross-section.

According to another implementation, the method includes, before oxidizing, extruding or drawing the metallic precursor alloy into a wire.

According to another implementation, a Bi2212 article is provided. The Bi2212 article may be formed according to any of the methods disclosed herein.

According to another implementation, Bi2212 wire is provided. The Bi2212 wire may be formed according to any of the methods disclosed herein.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 3 provides batch information regarding a number of different samples of a superconducting oxide according to the present disclosure.

FIG. 11($a$) is a plot of critical temperatures $T_c$ for samples A to E of FIG. 3.

FIG. 11($b$) is a plot of magnetic moment measurements for samples A to E of FIG. 3.

DETAILED DESCRIPTION

Figure 1:
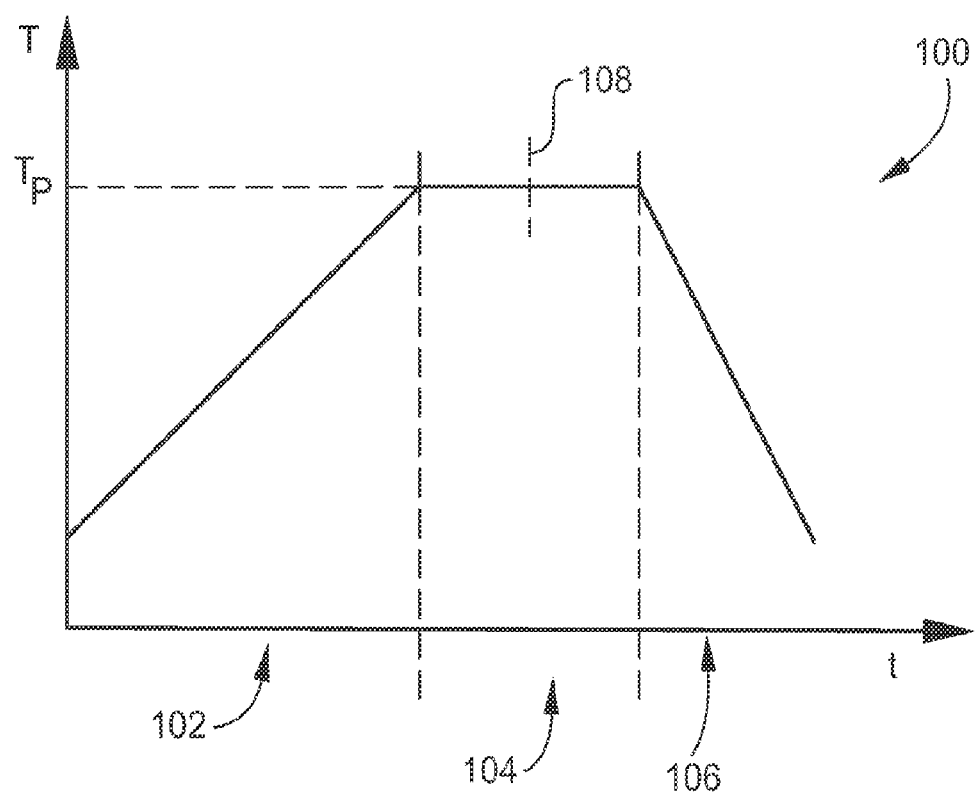
FIG. 1 is an example of a heat treatment profile that may be implemented in conjunction with forming a superconducting oxide according to the present disclosure.

In the present disclosure, the terms Bi2212, BSCCO and $Bi_2Sr_2CaCu_2O_x$ are used interchangeably to refer to bismuth strontium calcium copper oxide.

As used herein, the term "characteristic dimension" or "size" of a powder or other type of particle refers to a dimension descriptive of the size of the powder and which takes into account the overall shape of the powder. The term "characteristic dimension" or "size" is used interchangeably with the term "diameter," recognizing that a powder may have an irregular shape but may be considered as approximating a sphere. Moreover, in the context of a plurality of powders of a given type, a value given for the "characteristic dimension," "size" or "diameter" of the powders may be considered to be an average or nominal value, with no specific limitation being placed on the degree of polydispersity observed in the "characteristic dimension," "size" or "diameter" of the powders.

The present disclosure demonstrates the formation of the superconducting Bi2212 phase by the direct oxidation of metallic precursor powders. Through sufficient and accurately controlled mechanical alloying, ultra-fine metallic Bi2212 precursors are achievable and meet the requirements for further heat treatment. The metallic Bi2212 precursors comprise an appropriate mixture of bismuth (Bi), strontium (Sr), calcium (Ca) and copper (Cu), but without any oxygen so that the alloy remains a metal, not a ceramic. The present disclosure demonstrates that these metallic precursor powders can be oxidized to directly form the superconducting Bi2212 phase without forming any of the undesirable non-superconducting oxide phases that are ubiquitous to traditional Bi2212 wire processing, based on x-ray diffraction (XRD) analysis. The present disclosure demonstrates that the resultant Bi2212 is a high quality superconducting material, based on magnetic measurements.

The potential impact of utilizing metallic precursors for Bi2212 wires is significant because it addresses the key limitations currently preventing Bi2212 wires from progressing further. Metallic precursors are significantly more ductile, particularly in the form of nanopowders, than the oxide powers conventionally utilized. Thus, after wire drawing, metallic precursors are expected to be significantly denser, without the large void fraction observed in conventional technology. Moreover, because the conversion from metal to oxide as taught herein involves an increase in volume, the superconducting phase is expected to have a density of essentially 100% in wires formed in accordance with the present disclosure. This high density may increase the electrical and mechanical performance of the wire dramatically. Furthermore, because the native metals are all abundant, the available of the raw materials is not challenging. The scale-up of mechanically alloying metallic powder may be significantly easier than the scale-up of the processes utilized to form the Bi2212 starting powders conventionally employed.

An example of a method for forming a Bi2212 article will now be described. Bismuth, strontium, calcium and copper are provided as metallic starting (or precursor) powders. The size of the powders may range, for example, from 0.1 µm to 1000 µm. The powders may be weighed and mixed in a high-purity (i.e., oxygen-free) atmosphere. One example of an oxygen-free atmosphere is a controlled environment (e.g., a chamber) containing less than 1 ppm (part per million) oxygen. One way to achieve a high-purity environment is by filling (and purging) a chamber with one or more noble gases (e.g., argon, etc.) and/or a non-noble (yet inert) gas such as helium, nitrogen, etc. The strontium powders initially provided may be large relative to the other powder species, in which case the strontium powder may be subjected to grinding prior to mixing with the other species. The amounts of respective metallic species mixed may be at or near stoichiometric proportions.

The mixture is loaded in a suitable mechanical alloying device to form a metallic precursor alloy. For example, a milling vial of a mechanical alloying device may be charged with the mixture. The mechanical alloying device may be a ball milling or high-speed, high-energy ball milling device. An example of a high-energy ball milling device is a mixer/mill device commercially available from SPEX SamplePrep, LLC, Metuchen, N.J. Generally, the various types and operation of mechanical alloying devices and associated components are understood by persons skilled in the art. Milling vials are available in a wide variety of materials, such as stainless steel, hardened steel, tungsten carbide, iron, etc. However, in certain implementations of the presently disclosed method, it is advantageous to employ a ceramic milling vial (e.g., zirconia, alumina, silicon nitride, etc.) to eliminate or at least significantly decrease the introduction of impurities into the powders from the milling vial.

The milling (mechanical alloying) process is carried out in the high-purity atmosphere in the milling vial for a predetermined period of time. In some implementations, the ball milling device may be of the type that vibrates or agitates the milling vial with a back-and-forth and side-to-side motion. As one non-limiting example, the ball milling device vibrates the milling vial with a 5.9 cm back-and-forth and 2.5 cm side-to-side motion. The rate of vibration or agitation may, for example, range from about 850 to about 1100 cycles per minute. In some implementations, the milling time ranges from about 10 to about 50 hours, depending on various factors such as the milling media, milling ball sizes, mass ratio between the milling balls and the metallic powders, the desired homogeneity and distribution of the product, and the desire for forming intermetallic compounds during milling (described further below).

In some implementations, the mechanical alloying is performed at a controlled temperature. For example, it may be desirable to remove heat from the metallic precursor powders during the alloying process to avoid slight oxidation and/or prevent a reduction in efficiency of the milling process due to melting. Accordingly, mechanical alloying may be performed at a temperature ranging, for example, from about 77 K to about 320 K. The temperature may be controlled by employing an appropriate cooling system, for example by circulating a suitable heat transfer fluid such as liquid nitrogen.

Forming intermetallics during milling may enhance the mechanical properties and improve the formation of the oxide superconductor. Bismuth has a low melting point (271° C.) relative to the strontium (769° C.), calcium (842° C.), and copper (1085° C.). The bismuth fraction may be stabilized by pre-alloying it with strontium and/or calcium to form a high melting point intermetallic compound that ensures workability during further processing. Examples of intermetallics that may be formed include, but are not limited to, bismuth-inclusive pre-alloys such as bismuth-strontium ($Bi_2Sr_3$) with a melting point of 945° C. and bismuth-calcium (BiCa) with a melting point of 1075° C. Other intermetallic compounds with high melting points may also be suitable for formation during milling. Hence, in some implementations mechanical alloying is performed under one or more operating conditions effective for forming one or more types of intermetallic compounds in the metallic precursor alloy. Dry powder milling in an oxygen-free atmosphere, such as high-energy ball milling as described above, may be sufficient for forming intermetallic compounds. Milling under cryogenic conditions, or slurry milling with mineral oil, may also be effective. An intermetallic compound may be homogeneously integrated into the metallic precursor alloy by mechanically alloying two or more of the bismuth, strontium, calcium and copper species to form an intermetallic compound, mixing the intermetallic compound with the other metallic precursor powders, and mechanically alloying the intermetallic compound and the other metallic precursor powders.

In some implementations, a ceramic powder may be integrated into the metallic precursor alloy. The addition of ultra-fine ceramic powders may be beneficial to promoting the flux pinning effect in the application of a superconductor under a strong magnetic field, thereby preventing flux creep which reduces current density. Examples of ceramics that may be added include, but are not limited to, zirconia, alumina, silicon nitride, magnesium oxide, and combinations of two or more of the foregoing. The ceramic powder may be integrated by mixing the ceramic powder with the metallic precursor powders, followed by mechanically alloying the ceramic powder together with the metallic precursor powders to form the metallic precursor alloy (but including the ceramic) as described above. Alternatively, the metallic precursor powders may first be mechanically alloyed as described above to form the metallic precursor alloy, followed by mechanically alloying or grinding the ceramic powder with the metallic precursor alloy. In some implementations, the amount of ceramic in the metallic precursor alloy ranges from about 1% to about 20% molar fraction.

In some implementations, one or more noble metallic dopants such silver, gold, platinum, and/or palladium may be integrated into the metallic precursor alloy to enhance workability (i.e., mechanical properties such as strength, ductility, etc.) and transport properties. In the present context, a metal is "noble" in the sense that its oxide is less thermodynamically stable under the heat treatment conditions employed (described below) than the superconducting oxides. A noble metallic dopant may be homogeneously integrated by mixing the noble metallic dopant with the metallic precursor powders, followed by mechanically alloying the noble metallic dopant together with the metallic precursor powders. Alternatively, after mechanically alloying the metallic precursor powders to form the metallic precursor alloy, the noble metallic dopant may be integrated by mechanically alloying or grinding the noble metallic dopant with the metallic precursor alloy. After integration, the amount of the noble metallic dopant in the metallic precursor alloy may range, for example, from 1 to 50% by weight. The amount of the noble metallic dopant may depend on the desired density of the oxide superconductors, mechanical properties desired for further treatment (e.g., compacting, hot working, drawing, extruding, etc.), as well as other factors such as controlled interdiffusion between the Bi2212 phases and the dopants.

Once the metallic precursor alloy has been formed (with or without additives or dopants) as described above, the alloy is oxidized to form the superconducting oxide in a manner described below. In some implementations, prior to oxidization the alloy is further worked or processed as needed to form the alloy into a desired shape or article of manufacture. Like the mixing and alloying processes, this forming process is performed in a controlled high-purity atmosphere such as may be achieved in a glove box. The composition of the alloy at this stage, consisting of metallic precursors while being oxygen/oxide free (or substantially oxygen/oxide free), significantly facilitates the further processing into a desired shape or article. Moreover, the resulting shape or article may have a theoretical density of 90% or greater (i.e., the alloy occupies 90% or greater of the total volume of the shape or article). In some implementations, the resulting shape or article has a density of 99% or higher. Examples of shaped alloys or articles include, but are not limited to, a plate, a tape, a film, a rod, a wire having a round cross-section, or a wire having a polygonal cross-section. Any forming technique appropriate for the desired shape or article may be performed. Examples of forming techniques include, but are not limited to, compacting, hot working, drawing, extruding, folding, rolling, and combinations of two or more of the foregoing.

In some implementations, the metallic precursor alloy may be formed into a wire or rod, such as by extruding or drawing, with the high densities noted above. The wire may have a diameter ranging from, for example, about 0.5 mm to about 3 mm.

In some implementations, the metallic precursor alloy is first packed into a sheath (e.g., a hydrostatic cylindrical extrusion or can) composed of silver or a silver alloy (e.g., silver-magnesium or silver-aluminum), and the sheathed metallic precursor alloy is then extruded into a composite wire. In this case, the as-formed wire includes a metallic precursor alloy core and a silver or silver alloy cladding.

In some implementations, the metallic precursor alloy is first drawn into a monofilament rod. The monofilament rod is then cut into a plurality of shorter-length rods. A parallel arrangement of the shorter-length rods is then packed into a silver or silver alloy sheath comprising silver or a silver alloy, and the sheathed metallic precursor alloy is then extruded into a composite wire.

After the metallic precursor alloy has been formed as described above (with or without additives or dopants, and with or without being shaped into a wire or other structure), the alloy is subjected to a heat treatment profile to form the Bi2212 superconducting oxide. In addition to oxidization, the heat treatment may be designed to effect solid-state sintering of the superconducting oxide during oxidization and/or following oxidization. The heat treatment may, for example, combine oxidation with a further heat treatment such as partial melt processing, split melt processing, saw-tooth processing, or other type of processing beneficial to sintering of the superconducting oxide. The heat treatment may be carried out in a suitable chamber and associated system configured for controlling the processing conditions inside the chamber (e.g., predetermined variable temperature profile, gas flows and partial pressures, etc.). One or more stages of the heat treatment may be carried out in an oxygen-free atmosphere, while the oxidation stage is carried out in an oxygen-inclusive atmosphere such as by supplying oxygen gas ($O_2$) or air. The chamber or associated system may be configured for switching between an oxygen-free atmosphere and an oxygen-inclusive atmosphere at one or more programmable points in time during the heat treatment.

FIG. 1 is an example of a heat treatment profile 100 (temperature T as a function of time t). The heat treatment profile 100 includes a ramp-up (or heating) stage 102 during which the metallic precursor alloy is heated to a peak temperature $T_p$ in an oxygen-free atmosphere, a dwell (or constant-temperature) stage 104 during which the metallic precursor alloy is held at the peak temperature $T_p$ for a dwell time, and a ramp-down (or cooling) stage 106 during which the metallic precursor alloy is cooled down from the peak temperature $T_p$ (e.g., down to room temperature). In the present context, the term "constant" temperature may encompass a slight variation in temperature within a small tolerance found to be acceptable for the methods disclosed herein, and takes into account possible limitations in the temperature controlling apparatus that may arise in practice. The starting temperature of the heat treatment profile 100 may be room temperature, or may be slightly higher than room temperature due to, for example, a pretreatment cleaning step. In this example, at some point (arbitrarily indicated at 108) during the dwell stage 104 the oxygen-free atmosphere is switched to an oxygen-inclusive atmosphere. Consequently, the metallic precursor alloy is oxidized to form the Bi2212 superconducting oxide phase. Oxidation (and flow of oxygen) may continue for a period of time, and at a constant or varied temperature, depending on the particular implementation of the method.

In various implementations, the oxygen-inclusive atmosphere may be switched back to an oxygen-free atmosphere (such as by shutting off the flow of oxygen and purging the chamber by flowing a noble or inert gas) at some time before the beginning of the ramp-down stage 106; at or around the beginning of the ramp-down stage 106; at some time during the ramp-down stage 106; or at the end of the ramp-down stage 106. Sintering of the as-formed Bi2212 superconducting oxide generally occurs after the peak temperature $T_p$ has been reached, during oxidation and/or following oxidation. In some implementations, the density of the Bi2212 superconducting oxide in the finished article (e.g., after the ramp-down stage 106 is completed) may be 90% or greater.

Depending on the implementation, the heat treatment may be carried out over a period of a few hours or several hours, for example 2 to 10 hours. In various implementations, by way of example, heating during the ramp-up stage 102 is done at a heating rate ranging from 1° C./hour to 300° C./hour; the peak temperature $T_p$ that is held constant during the dwell stage 104 ranges from 700° C. to 880° C.; and cooling during the ramp-down stage 106 is done at a cooling rate ranging from 10° C./hour to 300° C./hour. In other implementations, the peak temperature $T_p$ may be higher than 880° C. In some implementations, the constant temperature that is maintained during the dwell stage 104 may be somewhat less than the peak temperature $T_p$. In some implementations, the metallic precursor alloy is oxidized at an oxygen partial pressure ranging from 1% to 50%. Generally, operating parameters such as the temperature during the various stages, the oxygen partial pressure during the various stages, and the time duration of each stage, may depend on each other as well as other factors affecting the workability and treatability of the Bi2212 superconducting oxide, such as the stoichiometry of the metallic precursors, the weight content of additives such as noble metal dopants, and the melting point(s) of intermetallic compounds formed during milling. Particular relationships among two or more operating parameters may be developed for particular implementations of the method.

Figure 2:
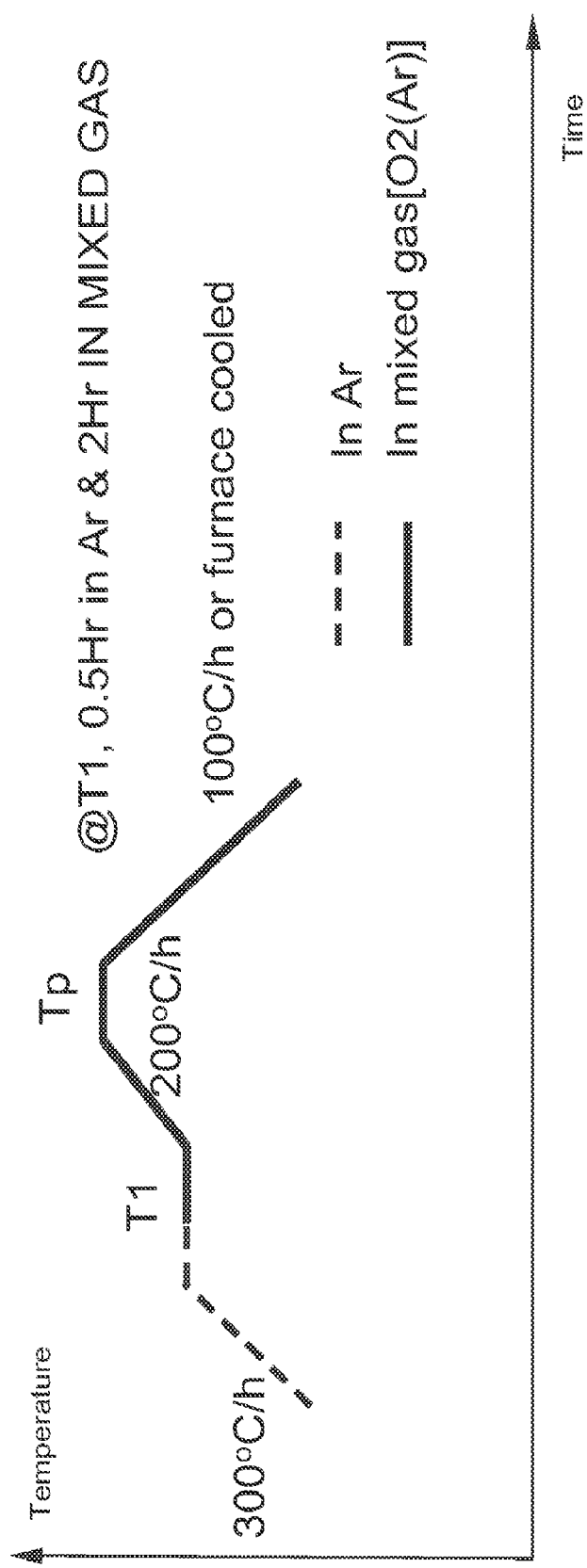
FIG. 2 is an example of another heat treatment profile that may be implemented in conjunction with forming a superconducting oxide according to the present disclosure.
Figure 4:
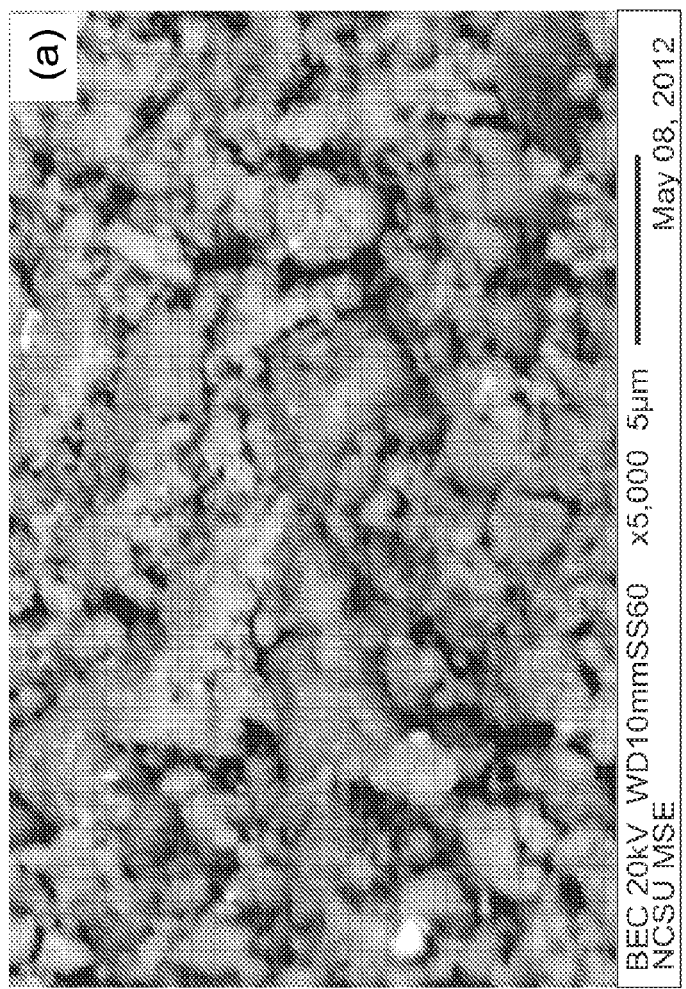
FIG. 4 is an SEM image of sample 3 of FIG. 3.
Figure 5:
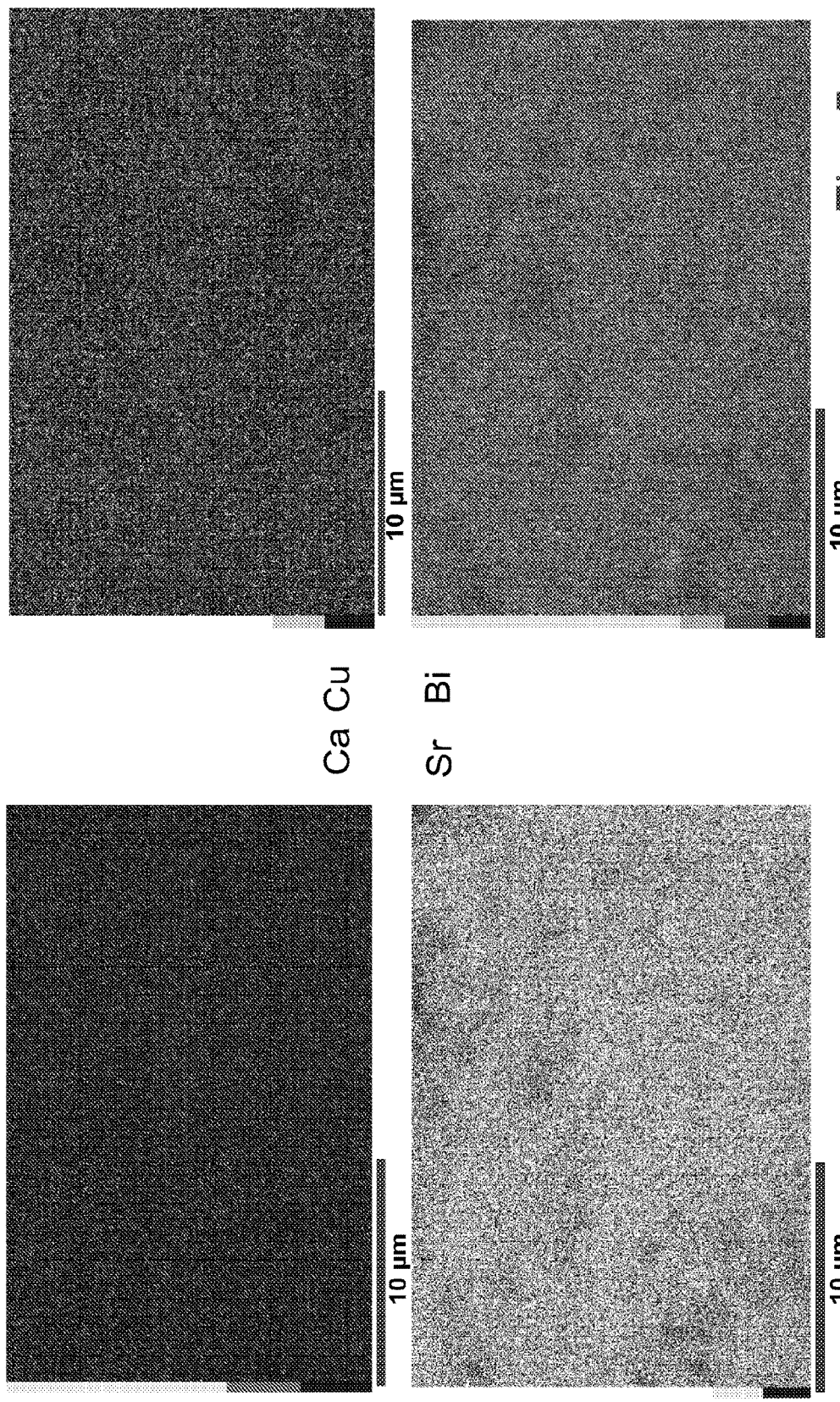
FIG. 5 is a set of micrographs of milled batches of Ca (image b), Cu (image c), Sr (image d), and Bi (image e).
Figure 6:
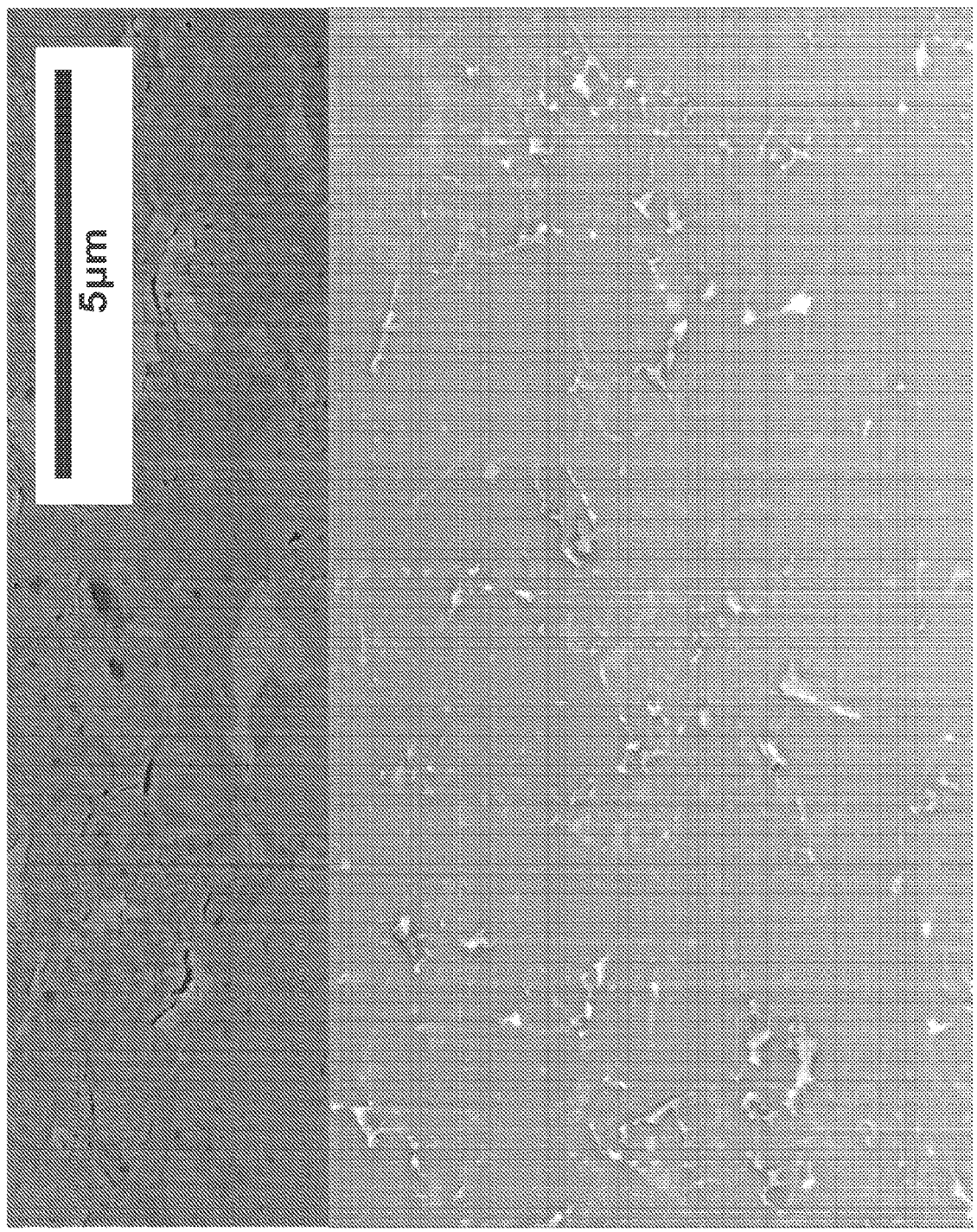
FIG. 6 is a micrograph of sample 3 of FIG. 3.
Figure 7:
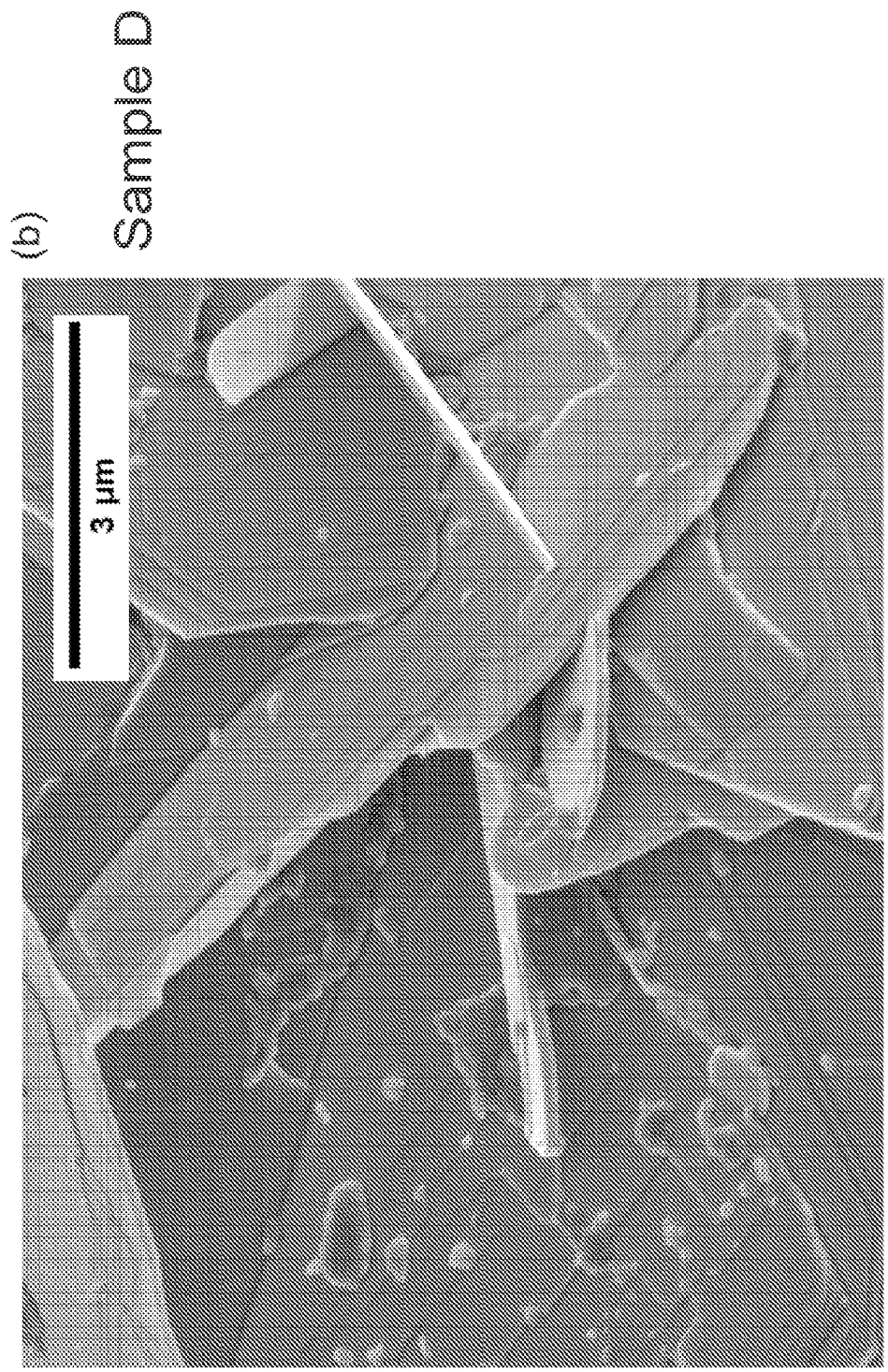
FIG. 7 is a micrograph of sample D of FIG. 3.
Figure 8:
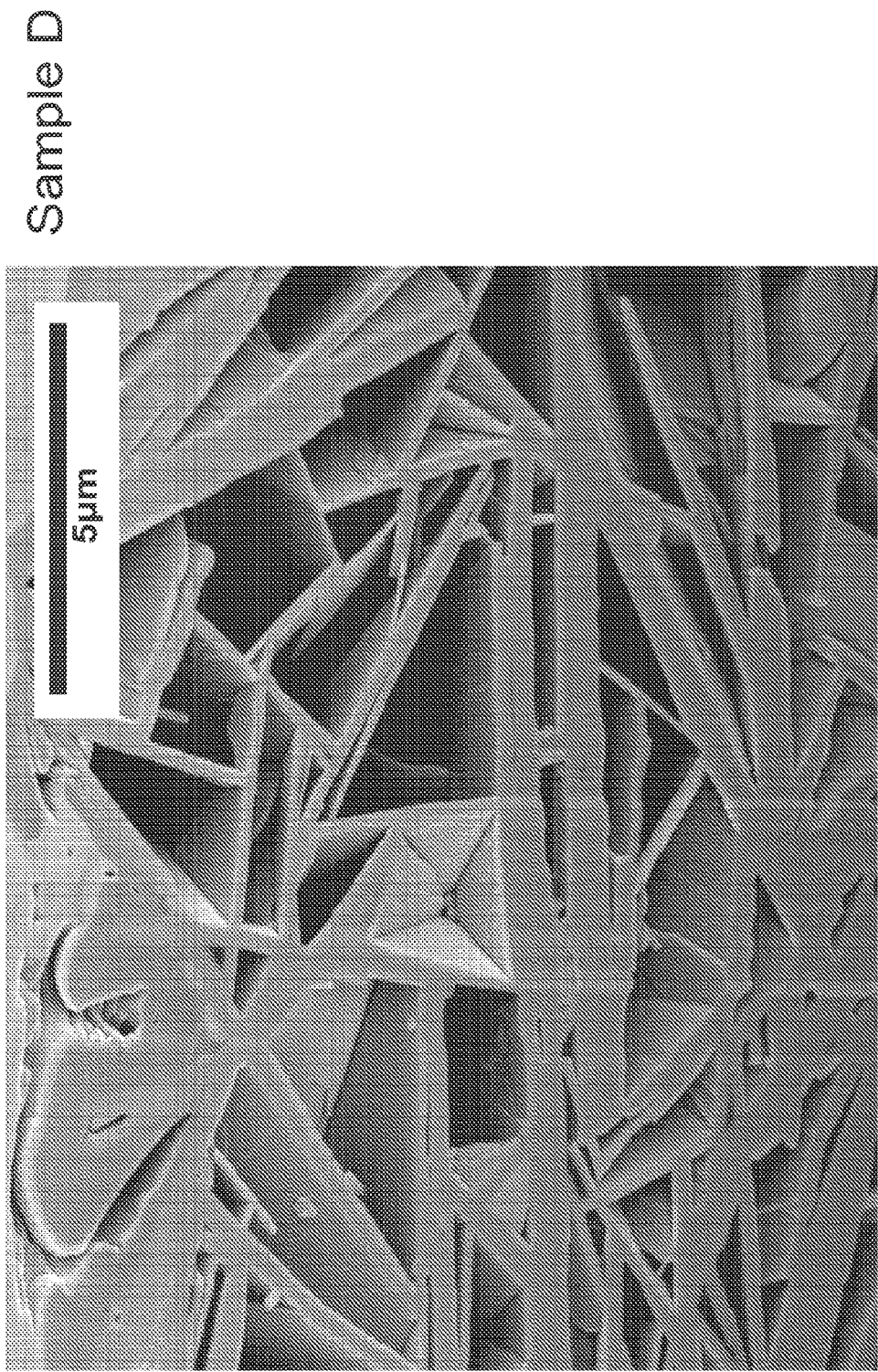
FIG. 8 is another micrograph of sample D of FIG. 3.
Figure 9:
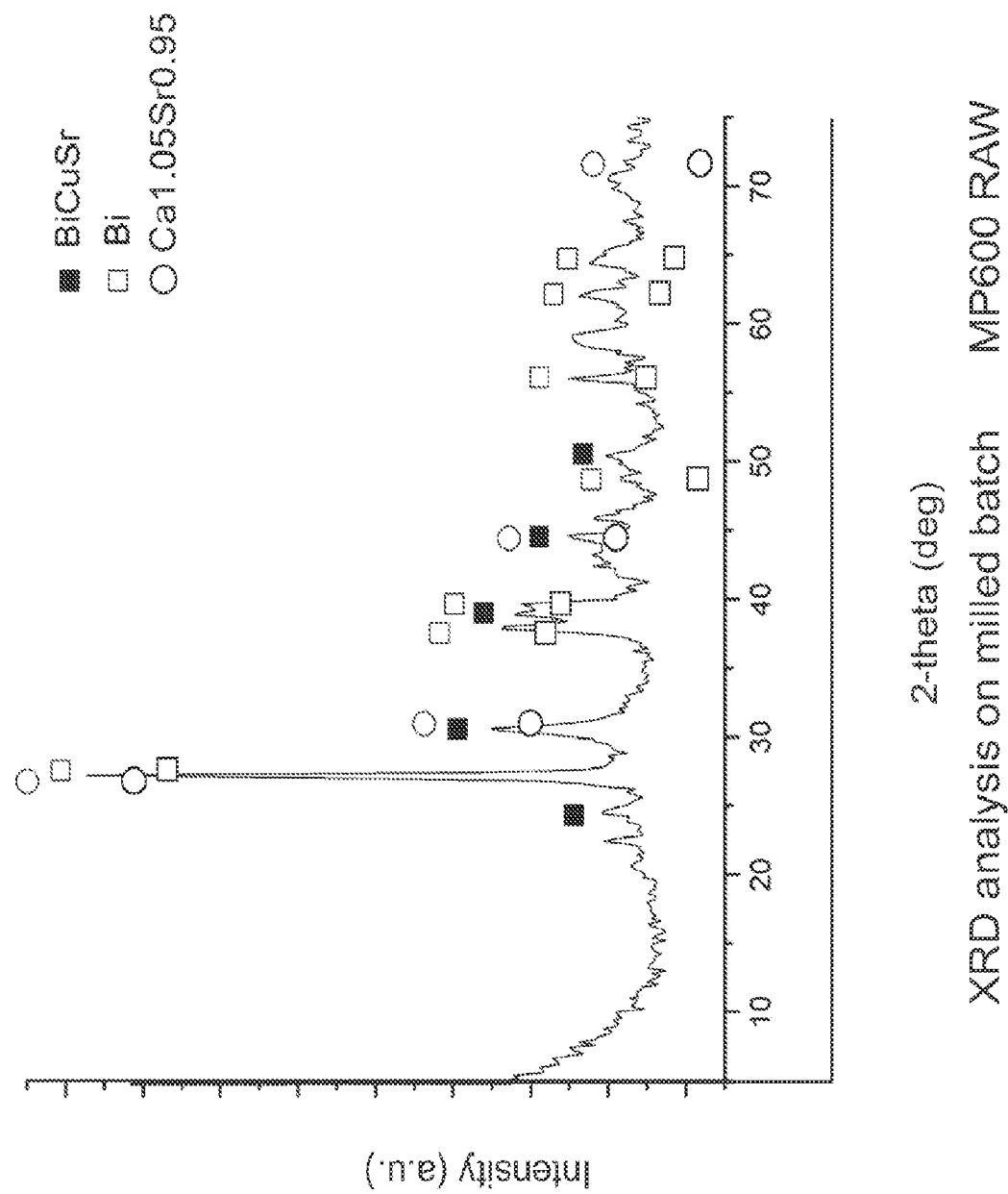
FIG. 9 is an XRD analysis of sample 3 of FIG. 3.
Figure 10:
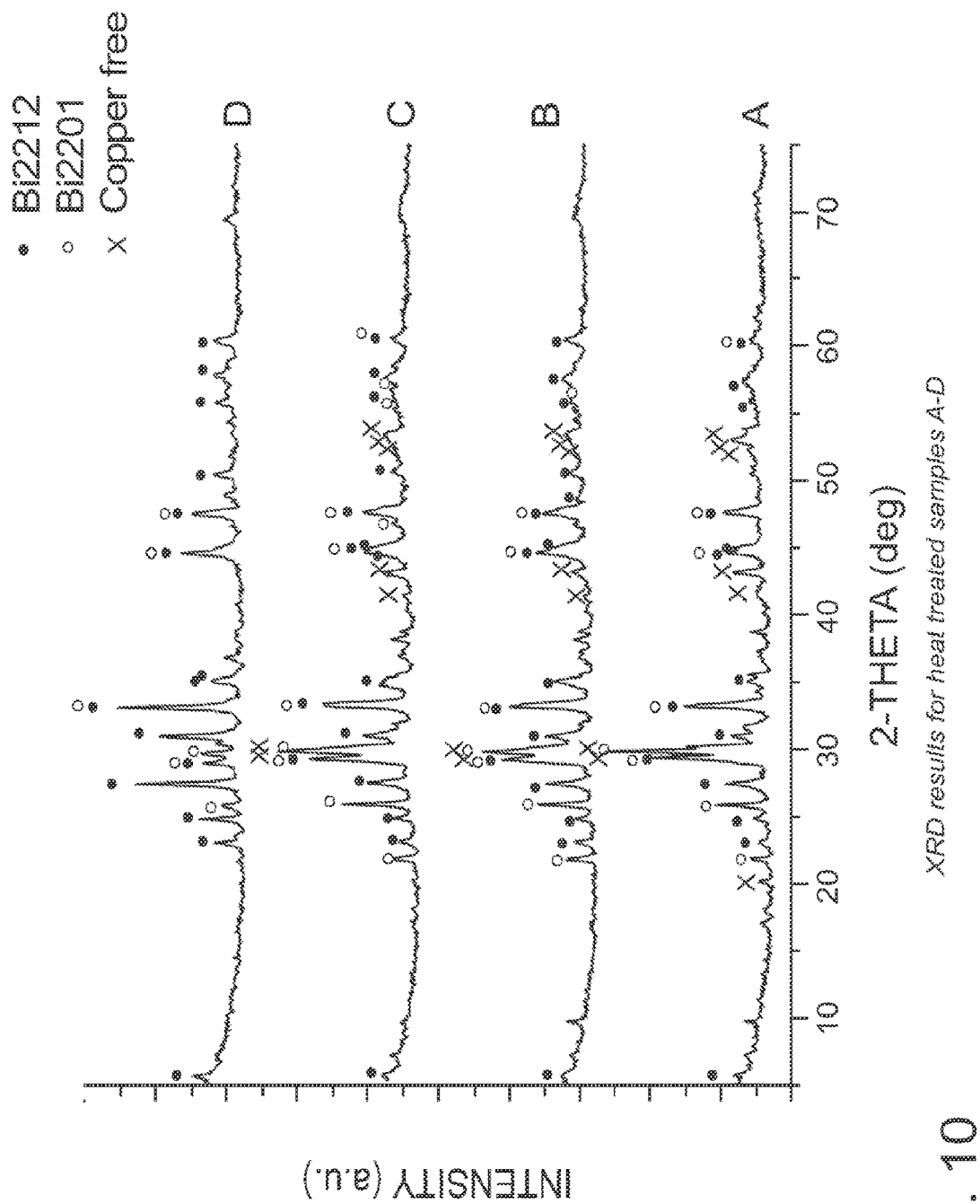
FIG. 10 is an XRD analysis of samples A to D of FIG. 3.

FIG. 2 is an example of another heat treatment profile 200. The heat treatment profile 200 includes a first ramp-up (or heating) stage 202 during which the metallic precursor alloy is heated to a first temperature $T_1$ in an oxygen-free atmosphere, a first dwell (or constant-temperature) stage 204 during which the metallic precursor alloy is held at the first temperature $T_1$ for a first dwell time, a second ramp-up stage 206 during which the metallic precursor alloy is heated to a peak temperature $T_p$, a second dwell stage 208 during which the as-formed superconducting oxide is held at the constant peak temperature $T_p$ for a second dwell time, and a ramp-down stage 210 during which the superconducting oxide is cooled down from the peak temperature $T_p$ temperature. The first dwell stage 204 may be utilized to initiate early oxidation at the first temperature $T_1$ (which is lower than the peak temperature $T_p$) to avoid vast melting of the metallic precursors and initiate the crystallization of the Bi2212. In FIG. 2, the dashed line indicates an oxygen-free atmosphere and the solid line indicates an oxygen-inclusive atmosphere.

In some implementations, sintering may be done at different temperature ranges, dwell times and cooling rates as desired to optimize the performance of the Bi2212 superconducting oxide. For example, sintering may be done at a temperature lower than the peak temperature $T_p$ following treatment at the peak temperature $T_p$. The sintering temperature may be chosen according to the phase diagram to ensure that the heat treatment condition fits the stable phase region. The oxygen-inclusive atmosphere may be adjusted during the sintering stage as needed to optimize the sintering condition. Moreover, there can be several variations (which may be small variations) in temperature after sintering as needed for optimization of the formation process. For example, the temperature may be varied to expedite formation of the Bi2212 and suppress the non-superconducting phases by creating new nucleation sites for Bi2212. Variations in temperature may be implemented so as to remain in the stable phase region, if necessary or desired.

It will be understood that FIGS. 1 and 2 are but two representative examples of heat treatment profiles that may be implemented in accordance with the present teachings. Other heat treatment profiles suitable for forming high-quality Bi2212 are encompassed by the present disclosure. Moreover, a given heat treatment profile may include other features or aspects not specifically illustrated in FIGS. 1 and 2. For example, additional temperature-holding and annealing stages may be included, and may entail different (e.g., intermediate) constant temperatures and connected by different heating or cooling rates.

Data acquired from samples formed in accordance with the present disclosure are provided in additional drawing sheets forming a part of the present application. The data includes stoichiometry, critical temperatures, SEM (scanning electron microscope) images, EDS (energy-dispersive X-ray spectroscopy) mapping, XRD (X-ray diffraction) analysis, and magnetic moment measurements.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A method for forming a Bi2212 article, the method comprising:
mixing a plurality of metallic precursor powders comprising bismuth, strontium, calcium and copper in an oxygen-free atmosphere;
mechanically alloying the metallic precursor powders in an oxygen-free atmosphere to form a metallic precursor alloy;
heating the metallic precursor alloy according to a temperature profile comprising a ramp-up stage during which the metallic precursor alloy is heated to a peak temperature in an oxygen-free atmosphere, a dwell stage during which the metallic precursor alloy is held at the peak temperature for a dwell time, and a ramp-down stage during which the metallic precursor alloy is cooled from the peak temperature; and
during at least a portion of the dwell stage, switching the oxygen-free atmosphere to an oxygen-inclusive atmosphere, wherein the metallic precursor alloy is oxidized to form a superconducting oxide,
wherein at least a portion of the temperature profile during oxidation or following oxidation is effective for sintering the superconducting oxide.

2. The method of claim 1, wherein mechanically alloying is done under an operating condition sufficient to form one or more intermetallic compounds in the metallic precursor alloy.

3. The method of claim 2, wherein the operating condition is selected from the group consisting of slurry milling with mineral oil, dry powder milling under an oxygen-free atmosphere, cryogenically, and high-energy ball milling.

4. The method of claim 2, wherein the one or more intermetallic compounds comprise a bismuth-inclusive pre-alloy.

5. The method of claim 2, wherein the one or more intermetallic compounds are selected from the group consisting of bismuth-strontium, bismuth-calcium, and both bismuth-strontium and bismuth-calcium.

6. The method of claim 1, comprising integrating a ceramic powder into the metallic precursor alloy.

7. The method of claim 6, wherein integrating comprises performing a step selected from the group consisting of: mixing the ceramic powder with the metallic precursor powders, followed by mechanically alloying the ceramic powder together with the metallic precursor powders; and after mechanically alloying the metallic precursor powders to form the metallic precursor alloy, mechanically alloying or grinding the ceramic powder with the metallic precursor alloy.

8. The method of claim 6, wherein the ceramic powder is selected from the group consisting of zirconia, alumina, silicon nitride, magnesium oxide, and a combination of two or more of the foregoing.

9. The method of claim 6, wherein, after integrating, the amount of the ceramic in the metallic precursor alloy ranges from 1 to 20% molar fraction.

10. The method of claim 1, comprising integrating a noble metallic dopant into the metallic precursor alloy.

11. The method of claim 10, wherein integrating comprises performing a step selected from the group consisting of: mixing the noble metallic dopant with the metallic precursor powders, followed by mechanically alloying the noble metallic dopant together with the metallic precursor powders; and after mechanically alloying the metallic precursor powders to form the metallic precursor alloy, mechanically alloying or grinding the noble metallic dopant with the metallic precursor alloy.

12. The method of claim 10, wherein the noble metallic dopant is selected from the group consisting of silver, gold, platinum, palladium, and a combination of two or more of the foregoing.

13. The method of claim 10, wherein, after integrating, the amount of the noble metallic dopant in the metallic precursor alloy ranges from 1 to 50% by weight.

14. The method of claim 1, wherein the temperature profile comprises a first ramp-up stage during which the metallic precursor alloy is heated to an intermediate temperature, and a first dwell stage during which the metallic precursor alloy is held at the intermediate temperature, and a second ramp-up stage following the first dwell stage during which the metallic precursor alloy is heated from the intermediate temperature to the peak temperature, and wherein the during which the metallic precursor alloy is held at the peak temperature is a second dwell stage.

15. The method of claim 14, comprising initiating oxidation occurs during the first dwell stage.

16. The method of claim 1, comprising, before oxidizing, forming the metallic precursor alloy into a shape.

17. The method of claim 16, wherein forming the metallic precursor alloy into the shape comprises extruding or drawing the metallic precursor alloy into a wire.

18. The method of claim 17, wherein the density of the metallic precursor alloy in the wire is 90% of theoretical density or greater.

19. The method of claim 17, wherein the wire has a diameter ranging from 0.5 mm to 3 mm.

20. The method of claim 17, wherein forming the metallic precursor alloy into the shape comprises packing the metallic precursor alloy into a sheath comprising silver or a silver alloy, and extruding the metallic precursor alloy and the sheath into a composite wire comprising a core of the metallic precursor alloy and a cladding of the silver or the silver alloy.

21. The method of claim 17, wherein forming the metallic precursor alloy into the shape comprises drawing the metallic precursor alloy into a monofilament rod, cutting the monofilament rod into a plurality of shorter-length rods, packing a parallel arrangement of the shorter-length rods into a sheath comprising silver or a silver alloy, and extruding the metallic precursor alloy and the sheath into a composite wire comprising a core of the metallic precursor alloy and a cladding of the silver or the silver alloy.

22. The method of claim 16, wherein forming the metallic precursor alloy into the shape is done in an oxygen-free atmosphere.

23. The method of claim 16, wherein forming the metallic precursor alloy into the shape comprises forming the metallic precursor alloy into a plate, a tape, a film, a rod, a wire having a round cross-section, or a wire having a polygonal cross-section.

24. The method of claim 1, wherein the metallic precursor powders have a characteristic dimension ranging from 0.1 μm to 1000 μm.

25. The method of claim 1, comprising, prior to mixing, grinding the strontium powders to reduce a characteristic dimension thereof.

26. The method of claim 1, wherein the oxygen-free atmosphere has a composition selected from the group consisting of a noble gas, nitrogen, helium, or a combination of two or more of the foregoing.

27. The method of claim 1, wherein mechanically alloying comprises ball milling or high-energy ball milling.

28. The method of claim 1, wherein mechanically alloying comprises loading the metallic precursor powders into a ball mill vial, and vibrating the ball mill at a rate ranging from 850 cycles/minute to 1100 cycles/minute for a duration ranging from 10 hours to 50 hours.

29. The method of claim 1, wherein mechanically alloying is done at a temperature ranging from 77 K to 320 K.

30. The method of claim 1, wherein mixing and mechanically alloying comprises mechanically alloying two or more of the bismuth, strontium, calcium and copper powders to form an intermetallic compound, mixing the intermetallic compound with the other metallic precursor powders, and mechanically alloying the intermetallic compound and the other metallic precursor powders.

31. The method of claim 1, wherein heating during the ramp-up stage is done at a heating rate ranging from 1° C./hour to 300° C./hour.

32. The method of claim 1, wherein heating during the dwell stage is done at a peak temperature ranging from 700° C. to 880° C.

33. The method of claim 1, wherein cooling during the ramp-down stage is done at a cooling rate ranging from 10° C./hour to 300° C./hour.

34. The method of claim 1, comprising oxidizing the metallic precursor alloy at an oxygen partial pressure ranging from 1% to 50%.

35. The method of claim 1, comprising switching the oxygen-inclusive atmosphere back to an oxygen-free atmosphere prior to the ramp-down stage, or during the ramp-down stage.

36. The method of claim 1, wherein the dwell stage during which oxidation occurs is a first dwell stage, and the temperature profile further comprises a second dwell stage subsequent to the first dwell stage, and further comprising holding the as-formed superconducting oxide during the second dwell stage at a temperature less than the peak temperature and effective for sintering the superconducting oxide.

37. The method of claim 1, wherein after the ramp-down stage, the density of the superconducting oxide in the Bi2212 article is 90% or greater.

* * * * *